United States Patent
Chen et al.

(10) Patent No.: US 12,374,519 B2
(45) Date of Patent: Jul. 29, 2025

(54) WAFER POSITIONING METHOD AND APPARATUS

(71) Applicant: Taiwan Semiconductor Manufacturing Co., Ltd., Hsinchu (TW)

(72) Inventors: Chia-Cheng Chen, Hsinchu (TW); Chun-Liang Chen, Hsinchu (TW); Liang-Yin Chen, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 523 days.

(21) Appl. No.: 17/458,972

(22) Filed: Aug. 27, 2021

(65) Prior Publication Data

US 2022/0415606 A1    Dec. 29, 2022

Related U.S. Application Data

(60) Provisional application No. 63/214,490, filed on Jun. 24, 2021.

(51) Int. Cl.
| | |
|---|---|
| H01L 21/66 | (2006.01) |
| H01J 37/20 | (2006.01) |
| H01J 37/22 | (2006.01) |
| H01J 37/304 | (2006.01) |
| H01J 37/317 | (2006.01) |
| H01L 21/265 | (2006.01) |

(52) U.S. Cl.
CPC .............. *H01J 37/20* (2013.01); *H01J 37/22* (2013.01); *H01J 37/3045* (2013.01); *H01J 37/3171* (2013.01); *H01L 21/265* (2013.01); *H01L 22/20* (2013.01); *H01J 2237/20214* (2013.01); *H01J 2237/30438* (2013.01)

(58) Field of Classification Search
CPC ........ H01J 37/20; H01J 37/22; H01J 37/3045; H01J 37/3171; H01J 2237/20214; H01J 2237/30438; H01L 21/265; H01L 22/20
See application file for complete search history.

(56) References Cited

U.S. PATENT DOCUMENTS

| | | | | |
|---|---|---|---|---|
| 5,451,261 A | * | 9/1995 | Fujii | H01L 21/67796 118/721 |
| 5,880,816 A | * | 3/1999 | Mimura | G03F 7/2028 356/612 |
| 2007/0095791 A1 | * | 5/2007 | Shinozaki | G03F 9/7003 156/345.55 |

(Continued)

OTHER PUBLICATIONS

JP-H03246404-A including English translation, Nov. 1, 1991, p.p. 1-7 (Year: 1991).*

*Primary Examiner* — Shaun M Campbell
(74) *Attorney, Agent, or Firm* — Slater Matsil, LLP (57) ABSTRACT

In an embodiment, a method includes: placing a wafer on an implanter platen, the wafer including integrated circuit dies; measuring a position of the wafer by measuring a position of an outer edge of the integrated circuit dies with a camera; determining an angular displacement between the position of the wafer and a reference position of the wafer; and rotating the implanter platen by the angular displacement.

20 Claims, 9 Drawing Sheets

(56) References Cited

U.S. PATENT DOCUMENTS

| | | | |
|---|---|---|---|
| 2011/0248190 A1* | 10/2011 | Tanaka | H01L 21/681 414/816 |
| 2015/0056043 A1* | 2/2015 | Hankes | H01L 21/67748 414/217 |
| 2017/0287752 A1* | 10/2017 | Godet | H01L 21/67213 |
| 2021/0011177 A1* | 1/2021 | Adler | G06T 7/0012 |

* cited by examiner

WAFER POSITIONING METHOD AND APPARATUS

PRIORITY CLAIM AND CROSS-REFERENCE

This application claims the benefit of U.S. Provisional Application No. 63/214,490, filed on Jun. 24, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an ion exposure apparatus includes a platen and one or more sensor(s) for detecting a position of a wafer on the platen. The position of the wafer is the angular position of the wafer (e.g., around an axis of rotation in the Z-direction). The wafer includes integrated circuit dies, which are patterned in the wafer. In some embodiments, the sensor(s) are cameras which capture images of the integrated circuit dies, and the position of the wafer is determined by measuring positons of the outer edges of the integrated circuit dies in the captured images using machine vision. Misalignment between the measured position of the wafer and a reference position for the wafer may thus be determined and corrected. The reference position for the wafer is a position where the wafer is angularly aligned with respect to an ion beam that will be generated by the ion exposure apparatus during operation. In some embodiments, the ion exposure apparatus is an implanter and the ion beam is generated to implant a desired element into the wafer. The platen is operable to rotate the wafer to correct misalignment of the position of the wafer with respect to the ion beam such that, during generation of the ion beam, the orientation of the wafer is angularly aligned with the orientation of the ion beam. Aligning the wafer with respect to the ion beam may improve within-wafer uniformity of the ion exposure process, reduce wafer-to-wafer process variations, reduce device defects, and improve device performance.

Figure 1:
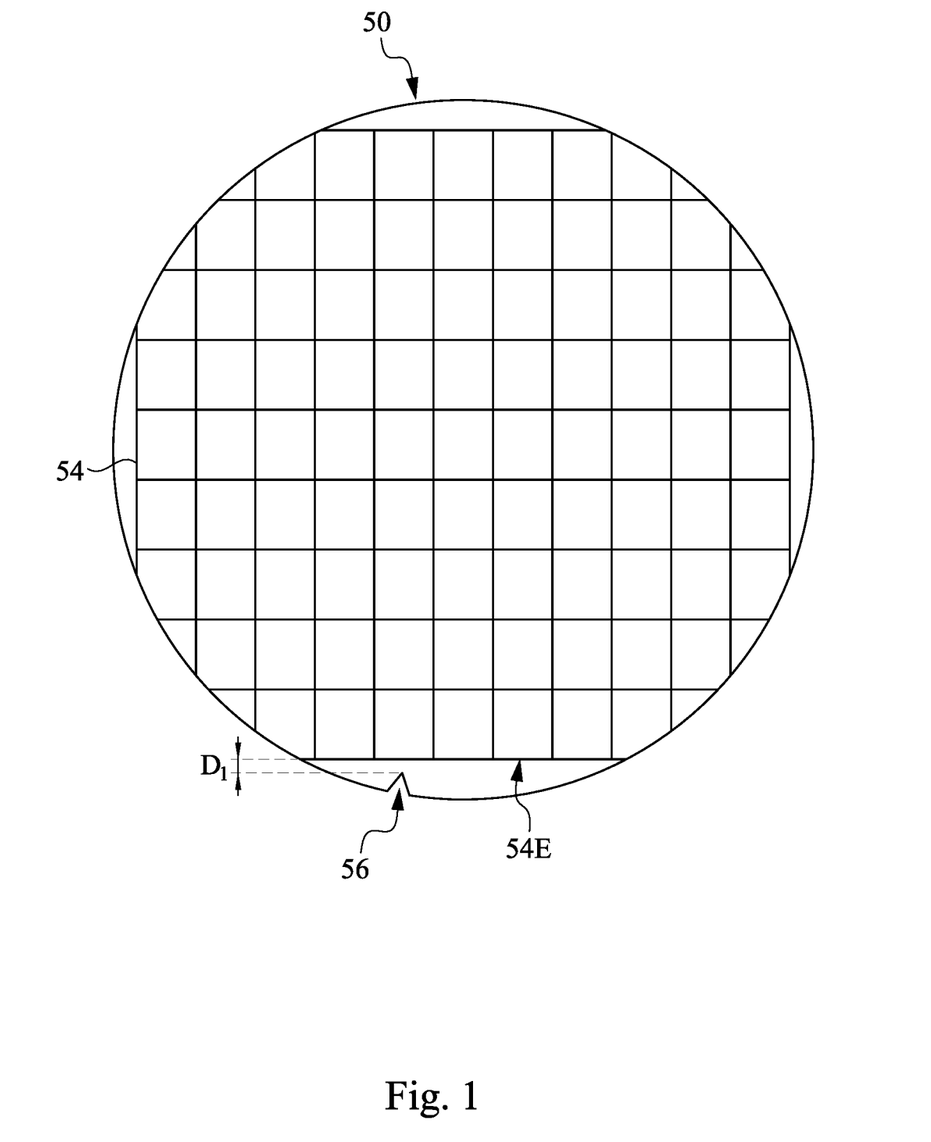
FIG. 1 is a top-down view of a wafer, in accordance with some embodiments.

FIG. 1 is a top-down view of a wafer 50, in accordance with some embodiments. As will be subsequently described in greater detail, the wafer 50 will be processed by an ion exposure process. In some embodiments, the ion exposure process is performed to implant a desired element (e.g., an n-type and/or p-type dopant) into the wafer 50.

The wafer 50 includes integrated circuit dies 54, which are formed in and/or on a substrate by performing photolithography and chemical processing techniques (e.g., deposition, etching, implanting, etc.). The substrate may be a silicon substrate. In some embodiments, the substrate includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. In some embodiments, the substrate is a semiconductor-on-insulator substrate, such as a silicon-on-insulator (SOI) substrate, a silicon germanium-on-insulator (SGOI) substrate, or a germanium-on-insulator (GOI) substrate.

The integrated circuit dies 54 include various material layers (e.g., dielectric material layers, semiconductor material layers, conductive material layers, and/or the like) and/or features (e.g., semiconductor features such as doped regions/features; metal features such as gate features, interconnect features, etc.; and/or the like) for forming integrated circuits. The integrated circuit dies 54 are laid out in a grid pattern in the wafer 50, which may be centered in the wafer 50. Scribe lines separate the integrated circuit dies 54, and the integrated circuit dies 54 will be subsequently diced by sawing along the scribe lines. The scribe lines define outer edges 54E of the integrated circuit dies 54, which are the outer borderline of the grid of the integrated circuit dies 54. The wafer 50 initially includes a notch 56. The patterning processes used to form the integrated circuit dies 54 are aligned to the notch 56 in the wafer 50. The notch 56 is large, and thus only provide coarse alignment. The integrated circuit dies 54 are formed so that the outer edges 54E are close to the notch 56. In some embodiments, a distance $D_1$ between the notch 56 and a closest outer edge 54E to the notch 56 is in the range of 0.5 mm to 2.0 mm. The notch 56 will be used as a coarse reference to help locate the closest outer edge 54E to the notch 56 during wafer alignment. In another embodiment, the outer edge 54E is not defined by scribe lines, but rather is defined by the border of a photoresist pattern used when forming the integrated circuit dies 54.

Figure 2:
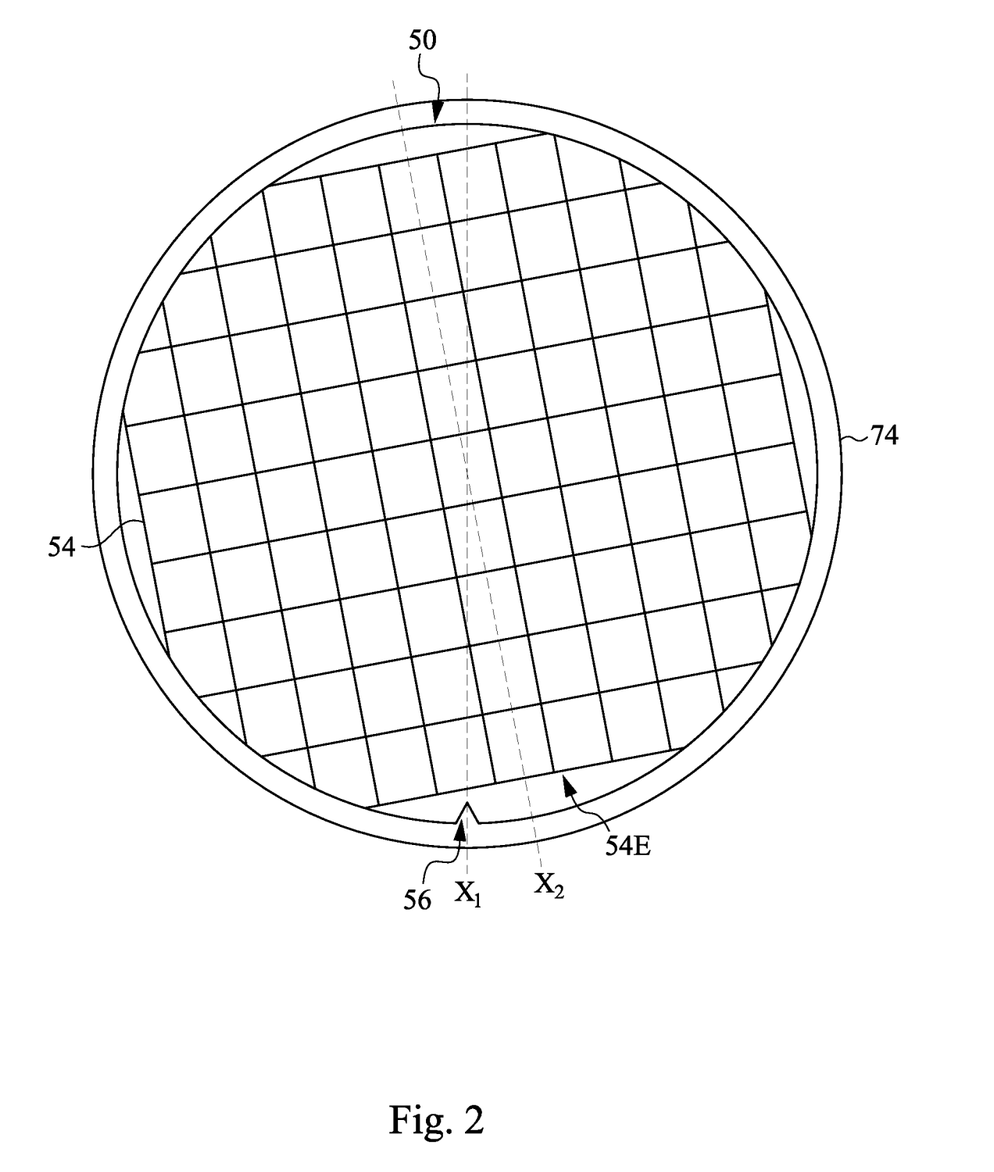
FIG. 2 is a top-down view of a wafer on a platen, in accordance with some embodiments.

During formation of the integrated circuit dies 54, one or more ion exposure process(es) are performed on the wafer 50. FIG. 2 is a top-down view of a wafer 50 on a platen 74 before an ion exposure process, in accordance with some embodiments. When the wafer 50 is initially placed on the platen 74, the notch 56 is used to angularly align the wafer 50 with a reference position (e.g., with respect to an ion beam that will be generated during the ion exposure process). However, as noted above, the patterning processes used to form the integrated circuit dies 54 are aligned to the notch 56, which only provides coarse alignment. Therefore, when the notch 56 is used to align the wafer 50 with the reference position, the wafer 50 may be linearly aligned with the reference position, but the outer edges 54E of the integrated circuit dies 54 may be angularly displaced from the reference position. For example, as shown in FIG. 2, the notch 56 may be angularly aligned with an axis $X_1$, which indicates the orientation of the ion beam, but the outer edges 54E of the integrated circuit dies 54 may be angularly aligned with an axis $X_2$, where the axis $X_2$ is angularly displaced from the axis $X_1$. As such, during generation of the ion beam, the orientation of the wafer may be angularly displaced from the orientation of the ion beam. As will be subsequently described in greater detail, the outer edges 54E of the integrated circuit dies 54 will be used by a wafer alignment process in which the platen 74 is rotated to reduce the angular displacement of the wafer 50 (also referred to as "rotational error") with respect to the ion beam. Aligning the wafer 50 with respect to the ion beam may improve within-wafer uniformity of the ion exposure process, reduce wafer-to-wafer process variations, reduce device defects, and improve device performance.

Figure 3A:
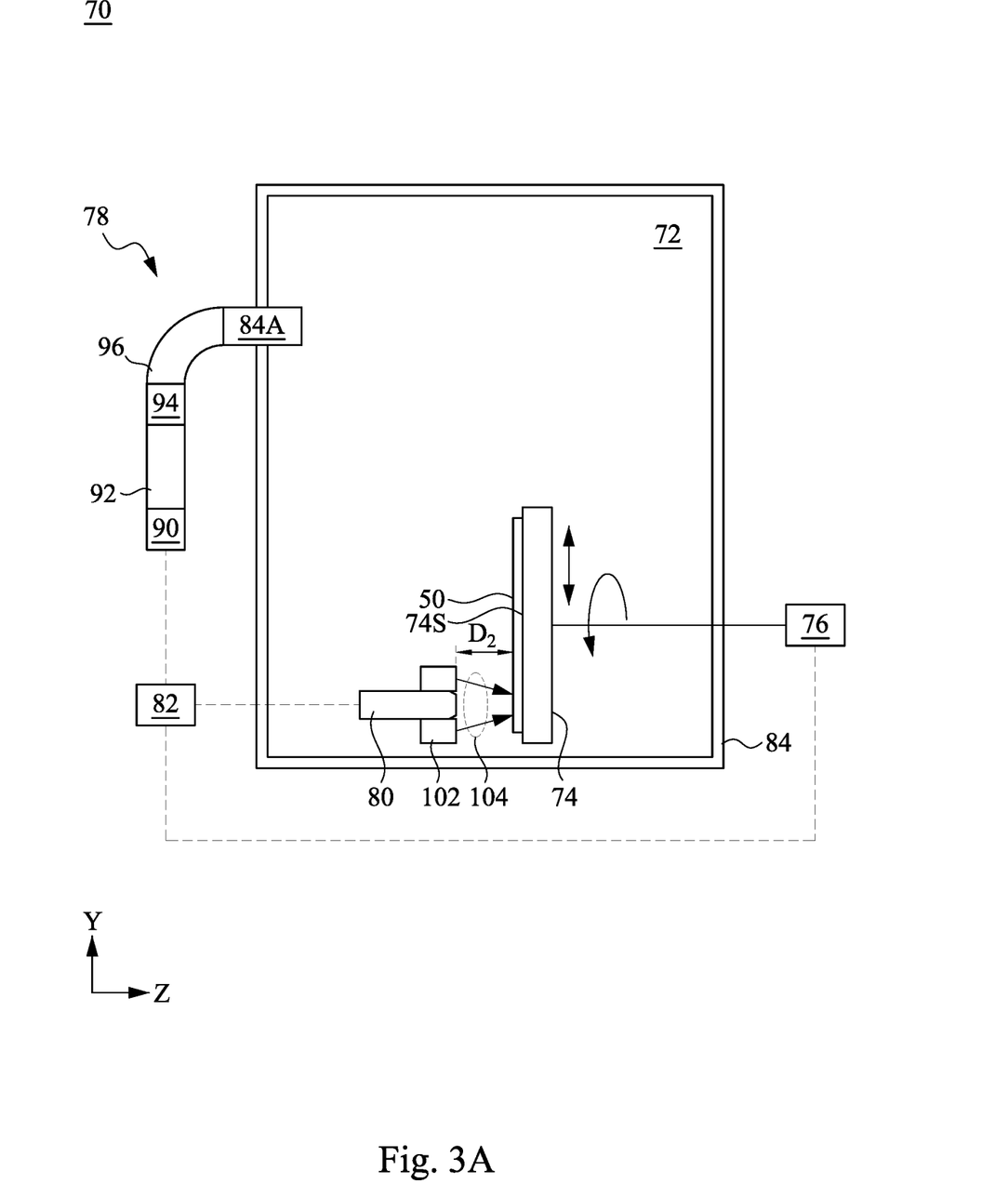
FIGS. 3A and 3B are diagrams of an ion exposure apparatus, in accordance with some embodiments.
Figure 3B:
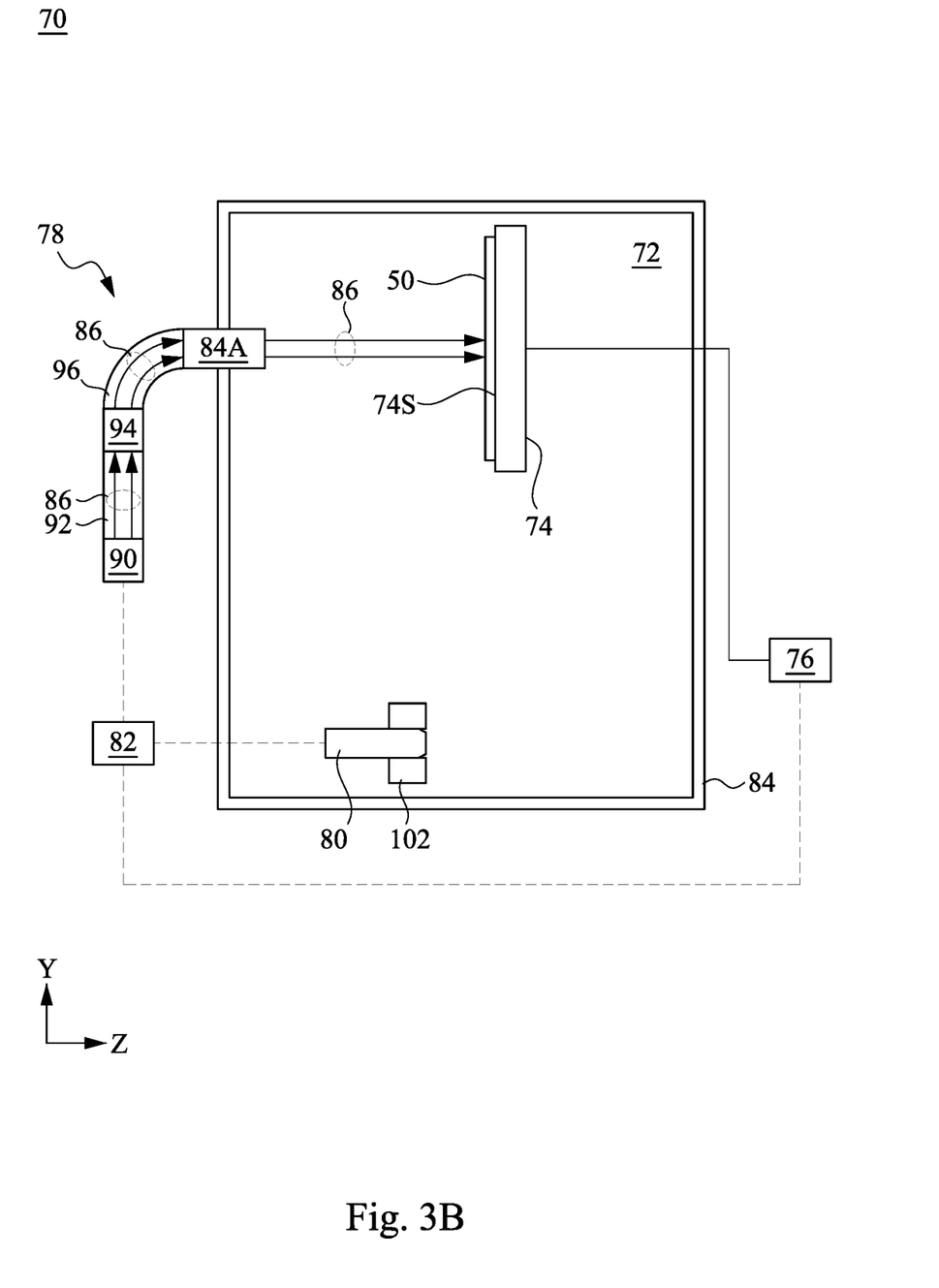

FIGS. 3A and 3B are diagrams of an ion exposure apparatus 70, in accordance with some embodiments. The ion exposure apparatus 70 is used to perform an ion exposure process in which a wafer 50 is exposed to an ion beam 86. The ion exposure apparatus 70 may be an implanter, an etcher, or the like. In some embodiments, the ion exposure apparatus 70 is an implanter. FIGS. 3A and 3B illustrate the ion exposure apparatus 70 in different states of operation, and are described together. In a first state of operation, the wafer 50 is disposed on a platen 74, and a wafer alignment process is performed using a camera 80 (or more generally, an alignment sensor) to reduce angular displacement of the wafer 50 with respect to the ion beam 86, as shown by FIG. 3A. In a second state of operation, after the wafer alignment process is completed, the ion exposure process is performed by generating the ion beam 86 and exposing the wafer 50 to the ion beam 86, as shown by FIG. 3B. The ion exposure apparatus 70 includes a chamber 72, a platen 74, a drive mechanism 76, an ion beam generator 78, a camera 80, and a controller 82.

The chamber 72 receives the wafer 50 and houses the wafer 50 during the ion exposure process. The chamber 72 may be any suitable shape for exposing the wafer 50 to the ion beam, such as a cylindrical shape, a hollow square tube, an octagonal shape, or the like. In some embodiments, the chamber 72 has a cylindrical sidewall, a planar bottom, and a planar top. The chamber 72 is defined by a chamber wall 84. The chamber wall 84 may be formed of a material that is inert to process conditions of the ion exposure process, such as steel, stainless steel, nickel, aluminum, combinations thereof, or like, so that the chamber wall 84 may withstand the chemistries involved in the ion exposure process. The chamber wall 84 may be shielded to improve inertness to the process conditions of the ion exposure process. For example, the chamber wall 84 may be covered with a plastic shield, coated with a polymer coating, or the like.

The platen 74 is disposed in the chamber 72, and is operable to support the wafer 50 during the ion exposure process. The platen 74 may be formed of a non-transparent material such as silicon carbide, graphite with a silicon carbide coating, combinations thereof, or the like. The platen 74 may be an implanter platen, an etcher platen, or the like, depending on the function of the ion exposure apparatus 70. The wafer 50 may be secured to a top surface 74S of the platen 74 using vacuum pressure, electrostatic forces, or the like. The top surface 74S of the platen 74 is faced towards the ion beam generator 78 during operation so that the ion beam 86, when generated, is normal to the top surface 74S of the platen 74. The wafer 50 is thus exposed to the ion beam 86. The platen 74 may include heating and/or cooling mechanisms in order to control the temperature of the wafer 50 during the ion exposure process. Depending on the function of the ion exposure apparatus 70, the platen 74 may include additional features which are desirable for that function. In some embodiments where the ion exposure apparatus 70 is an etcher, the platen 74 includes a bias generator operable to generate a bias (e.g., a direct current (DC) bias) on the wafer 50.

The drive mechanism 76 is connected to the platen 74, and is operable to rotate the platen 74 within the chamber 72 to reduce the angular displacement of the wafer 50 with respect to the ion beam 86. Specifically, the drive mechanism 76 is operable to rotate the platen 74 around an axis of rotation (e.g., in the Z-direction), and is also operable to translate the platen 74 in a linear direction (e.g., in the X-direction and the Y-direction). The axis of rotation is perpendicular to the top surface 74S of the platen 74, and the plane of translation is parallel to the top surface 74S of the platen 74. In some embodiments (subsequently described for FIGS. 6A and 6B), the drive mechanism 76 is also operable to tilt the platen 74 so that the wafer 50 may be oriented in different directions during different states of operation. For example, the wafer 50 may be oriented to be parallel to the ion beam 86 during the wafer alignment process (e.g., in the first state of operation), and the drive mechanism 76 may then be used to tilt the platen 74 by 90 degrees so that the wafer 50 is perpendicular to the ion beam 86 during the ion exposure process (e.g., in the second state of operation).

The ion beam generator 78 is operable to generate the ion beam 86. In some embodiments where the ion exposure apparatus 70 is an implanter, the ion beam 86 is a beam of ions of a desired material, and the ion beam 86 is directed at the wafer 50 so that the material is impinged on (and thus implanted in) the wafer 50. For example, the material may be a dopant that is implanted into semiconductor features that were patterned in the wafer 50. The ion beam generator 78 includes an ion source 90, a linear accelerator 92, a scanning unit 94, and a separation magnet 96.

The ion source 90 may include a variety of components which are used to generate the ion beam 86. For example, the ion source 90 may include ion separation devices, ion acceleration devices, multiples or combinations thereof, or the like. In some embodiments, the ion source 90 is an arc discharge ion source. The ion source 90 may generate the ion beam 86 from various atoms or molecules, which may include boron (B), aluminum (Al), gallium (Ga), indium (In), carbon (C), silicon (Si), germanium (Ge), nitrogen ($N_2$), phosphorous (P), arsenic (As), antimony (Sb), oxygen ($O_2$), fluorine ($F_2$), helium (He), argon (Ar), carbon monoxide (CO), carbon dioxide ($CO_2$), boron mono-fluoride (BF), boron di-fluoride ($BF_2$), boron tri-fluoride ($BF_3$), silicon mono-fluoride (SiF), silicon di-fluoride ($SiF_2$), silicon tri-fluoride ($SiF_3$), silicon tetrafluoride ($SiF_4$), phosphorous dimer ($P_2$), silane ($SiH_4$), methane ($CH_4$), combinations thereof, or the like. However, other atoms or molecules may be used as the ion source 90. The ion source 90 may produce ions having a broad range of charge-to-mass ratios with only a certain narrower range of charge-to-mass ratios being suitable for the ion exposure process. As such, the ion beam 86 may be directed towards a separation magnet which electromagnetically separates those ions having desired charge-to-mass ratios for the ion exposure process from those ions having undesired charge-to-mass ratios (also referred to as a "mass analysis magnet"). The ion beam 86 thus includes ions having suitable charge-to-mass ratios. Next the ion beam 86 may be passed through an aperture in order to further enhance and control the divergence of the ion beam 86. In some embodiments, the aperture is an aperture with an adjustable width that can adjust the magnitude of the ion beam 86. Once the ion beam 86 passes through the aperture, the ion beam 86 may be sent to a linear accelerator 92.

The linear accelerator 92 may be used to impart additional energy to the ion beam 86 as it passes through the linear accelerator 92. The linear accelerator 92 imparts this additional energy using a series of electrodes (not separately illustrated) that generate an electromagnetic field. When the ion beam 86 passes through the electromagnetic field, the electromagnetic field works to accelerate the ion beam 86. The linear accelerator 92 may include multiple electromagnetic fields and may vary the electromagnetic fields periodically with time or may adjust the phase of the electromagnetic fields to accommodate ions with different atomic numbers as well as ions having different initial speeds.

Once accelerated, the ion beam 86 is directed towards a scanning unit 94. The scanning unit 94 is used to scan the ion beam 86 across the surface of the wafer 50. The scanning unit 94 may include at least a pair of horizontal electrodes and a pair of vertical electrodes for controlling horizontal scanning and vertical scanning, respectively, of the ion beam 86. In some embodiments, the scanning unit 94 is operable to scan the ion beam 86 to cover the entire area of the wafer 50. In some embodiments, the platen 74 is moved to scan the ion beam 86 to cover the entire area of the wafer 50. The drive mechanism 76 may be used to control the position of the wafer 50 relative to the ion beam 86. As such, the scanning unit 94 may be omitted in some embodiments.

After the ion beam 86 is passed through the scanning unit 94, the ion beam 86 is passed through a converging unit. The converging unit may be utilized to modify the convergence and divergence of the ion beam 86, which may arrive from the linear accelerator 92 to the scanning unit 94 as a substantially parallel beam. In some embodiments, the converging unit includes one or more (such as three) multipole lenses. The multipole lenses may include a uniformity multipole lens, a collimator multipole lens, combinations thereof, or the like. However, any suitable number and type of lenses may be utilized. After the ion beam 86 is passed through the converging unit, the ion beam 86 is passed through a separation magnet 96 which may be used to remove ions and/or neutral particles that have been generated with undesired charge-to-mass ratios (also referred to as a "final energy magnet"). The separation magnet 96 may electromagnetically separate ions having desired charge-to-mass ratios for the ion exposure process from those ions having undesired charge-to-mass ratios.

After the ion beam 86 is passed through the separation magnet 96, the ion beam 86 is delivered to the platen 74 through an aperture 84A in the chamber wall 84. In some embodiments, the ion beam 86 is delivered to the platen 74 as a spot beam, which has a circular cross-section. In some embodiments, the ion beam 86 is be delivered to the platen 74 as a ribbon beam, which has a rectangular cross-section. The scanning unit 94 may be used to scan the ion beam 86 across the surface of the wafer 50 such that a uniform ion distribution is achieved across the surface of the wafer 50. As will be subsequently described in greater detail, the wafer 50 is angularly aligned with respect to the ion beam 86 in a wafer alignment process, prior to the ion exposure process, which helps increase the uniformity of the ion distribution across the surface of the wafer 50. This improves within-wafer uniformity of the ion exposure process, reduces wafer-to-wafer process variations, reduces device defects, and improves device performance.

The camera 80 may be disposed in the chamber 72, and is used to measure the position of the wafer 50 on the platen 74. In the illustrated embodiment, the camera 80 is disposed in the chamber 72. In another embodiment (subsequently described for FIGS. 6A and 6B), the camera 80 is disposed outside of the chamber 72. As will be subsequently described in greater detail, a wafer alignment process is performed in which the angular displacement of the wafer 50 with respect to the ion beam 86 is determined using the camera 80, and the drive mechanism 76 is used to rotate the platen 74 relative to the ion beam 86 so as to reduce the angular displacement. The angular displacement of the wafer 50 may be determined by measuring the position of an outer edge 54E of the integrated circuit dies 54 (see FIG. 2) using the camera 80. In some embodiments, the position of the outer edge 54E of the integrated circuit dies 54 is measured by capturing an image of the outer edge 54E of the integrated circuit dies 54 with the camera 80 and detecting the position of the outer edge 54E of the integrated circuit dies 54 in the image using machine vision. The camera 80 may be charge-coupled device (CCD) cameras, complementary metal-oxide-semiconductor (CMOS) cameras, or the like. In some embodiments, the ion exposure apparatus 70 further includes one or more light source(s) 102 which are operable to generate light 104 and illuminate the wafer 50 so that the images captured with the camera 80 have a high contrast. The light source(s) 102 may be camera flashes or the like, and the light 104 generated by the light source(s) 102 may be light that provides a high contrast, such as white light. The position of the outer edge 54E of the integrated circuit dies 54 may thus be more accurately detected by the camera 80. The light 104 generated by the light source(s) 102 may have a ring shape, a spotlight shape, or the like.

The resolution of the camera 80 is constrained by the focal length of the camera 80 and the distance between the camera 80 and the wafer 50 (also referred to as the "working distance"). Specifically, the resolution of the camera 80 should be large enough to resolve objects that are the dimensions of the outer edges 54E of the integrated circuit dies 54. The outer edges 54E of the integrated circuit dies 54 are small, and the resolution of the camera 80 should be large enough to measure the angular displacement of the wafer 50 with ±0.1 degree of error. When a small focal length is used, the camera 80 is operated at a small working distance so that the angular displacement may be measured with sufficient accuracy, and so the camera 80 may be disposed in the chamber 72. When a large focal length is used, the camera 80 may be operated at a large working distance while still measuring the angular displacement with sufficient accuracy, and so the camera 80 may be disposed outside of the chamber 72. Further, the resolution of the camera 80 is constrained by the field of view (FOV) of the camera 80, as a large FOV causes the sensor size of the camera 80 to be large. If the FOV is too large, the camera 80 may not fit in the chamber 72. For example, if the FOV is larger than about 90 mm, then the sensor size of the camera 80 may be greater than about 100 mm, which is too large for some chambers 72. In this embodiment, the camera 80 has a small focal length, such as a focal length in the range of 6.4 mm to 32 mm. When a small focal length is used, the camera 80 may be disposed in the chamber 72, has a small FOV, and has a small working distance. In some embodiments, the camera 80 has a sensor size of one-quarter inch, a working distance $D_2$ in the range of 0.1 m to 0.5 m, a FOV in the range of 3 mm to 90 mm, and a resolution in the range of 0.05 µm to 0.1 µm.

The wafer alignment process is performed before the ion exposure process. Specifically, the wafer alignment process is performed before the ion beam 86 is generated, and is performed with the platen 74 disposed in a first position, as shown in FIG. 3A. After the wafer alignment process, the platen 74 is moved to a second position and the ion beam 86 is generated, as shown in FIG. 3B. The first position of the platen 74 is outside of the path of the ion beam 86 and the second positon of the platen 74 is in the path of the ion beam 86. The platen 74 is moved from the first position to the second position by translating the platen 74 along a direction (e.g., the Y-direction) with the drive mechanism 76. The wafer alignment process is performed while the platen 74 is in the first position, and the wafer 50 is moved relative to where the ion beam 86 will be generated when the platen 74 is in the second position. The distance between the first position and the second position is a constant distance that can be accounted for when aligning the wafer 50 with respect to the ion beam 86. In other words, the wafer alignment process is performed by determining where the ion beam 86 will be generated when the platen 74 is in the second position, and aligning the wafer 50 with respect to the ion beam 86 while the platen 74 is in the first position. Performing the wafer alignment process in the first position allows the camera 80 to be disposed outside of the path of the ion beam 86, reducing interference with the ion beam 86 during the ion exposure process, and also reducing the accumulation of contaminants (e.g., particles) on the camera 80. The accuracy of the wafer alignment process may thus be improved. In this embodiment, the platen 74 has the same orientation in the first position and in the second position A controller 82 is communicatively coupled to the various features of the ion exposure apparatus 70, and is operable to control the operating parameters of the ion exposure apparatus 70. The controller 82 may be implemented in either hardware or software, and the parameters may be hardcoded or input to the controller 82 through an input device. The controller 82 may be used to store and control parameters associated with the operation of the ion exposure apparatus 70, such as the desired ion beam current, the current to the accelerator electrodes, and the like. Additionally, the controller 82 may also be used to control the platen 74 and, more specifically, the drive mechanism 76 to control the position, direction of movement, tilt angle, and the like of the wafer 50 with respect to the ion beam 86.

Figure 4:
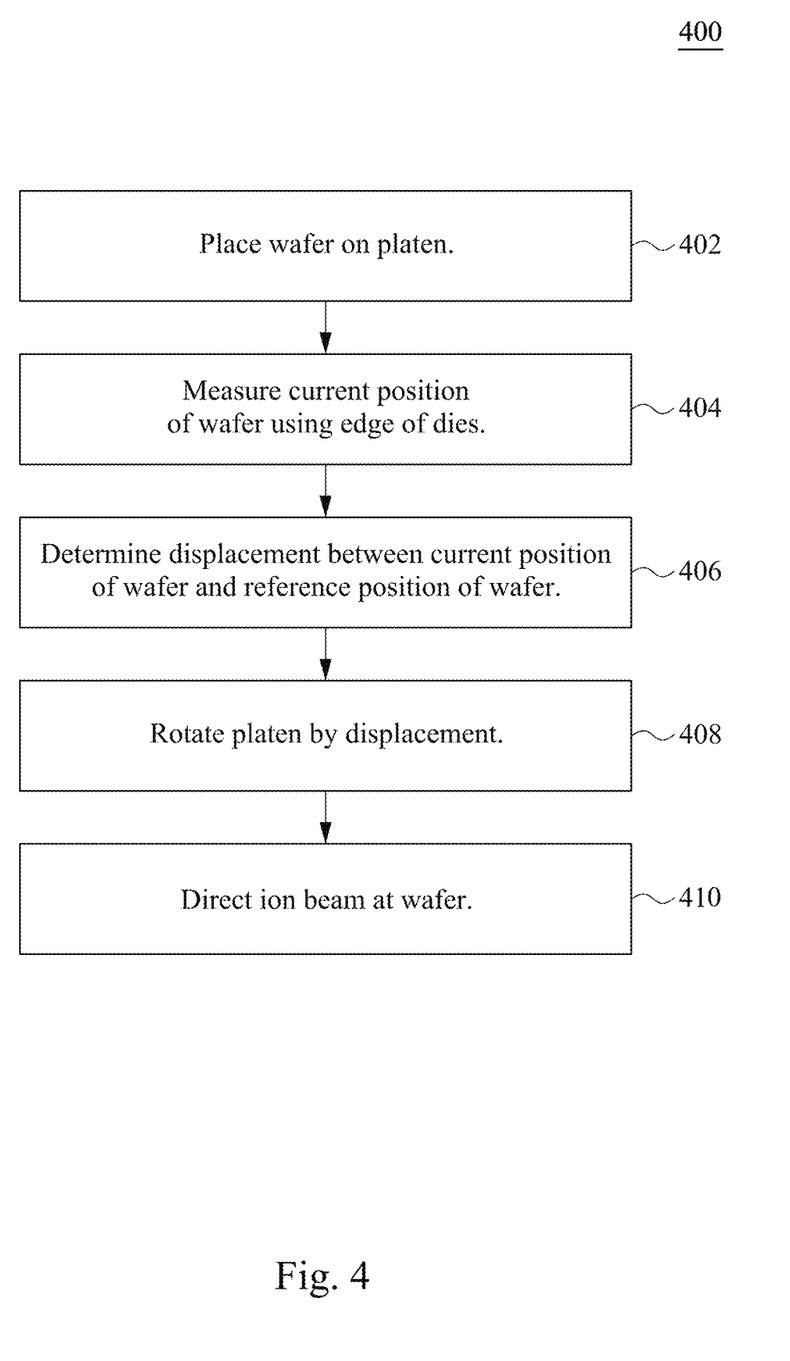
FIG. 4 is a flowchart of a method for manufacturing a semiconductor device, in accordance with some embodiments.
Figure 5A:
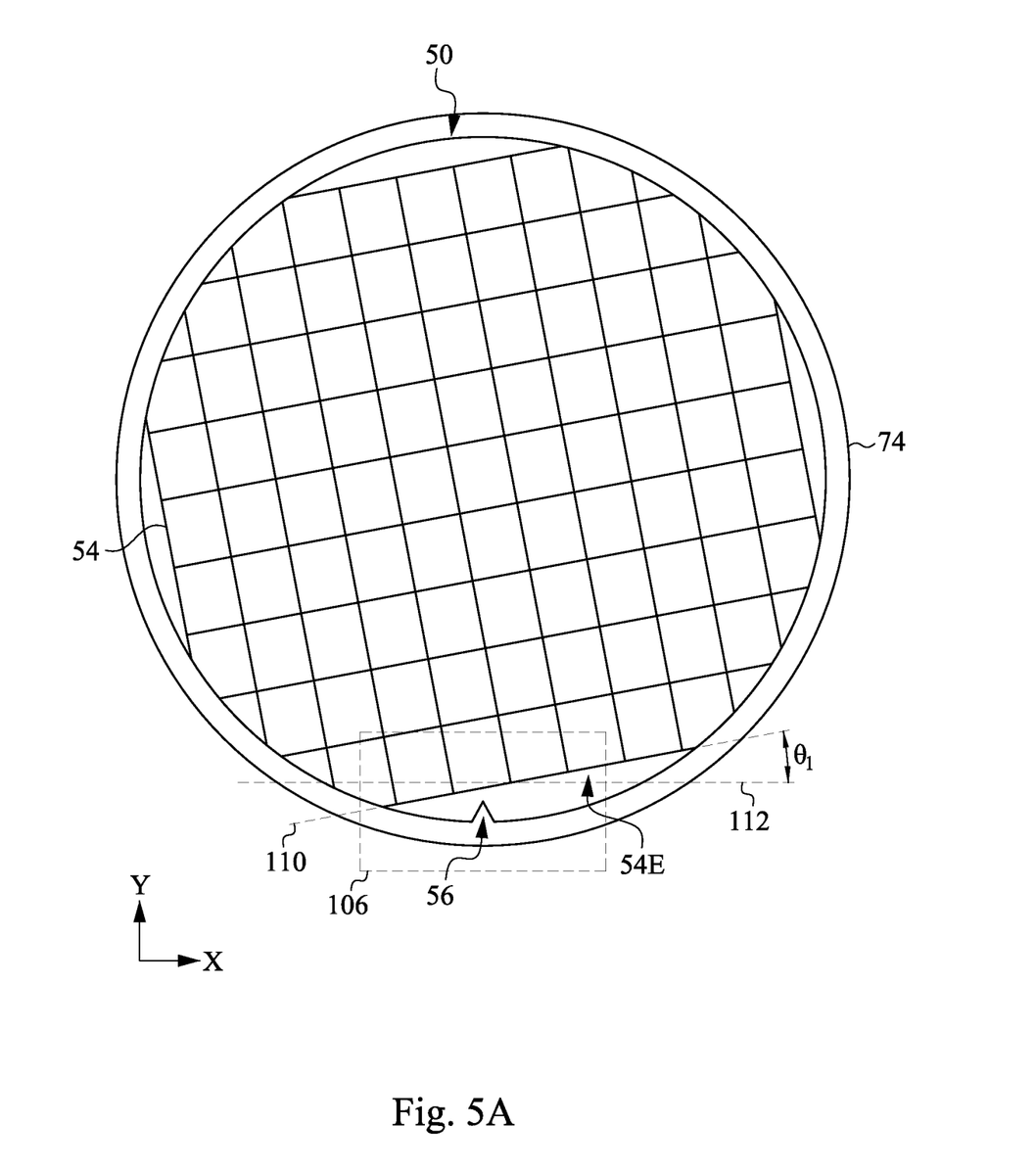
FIGS. 5A and 5B are top-down views of a platen during a wafer alignment process, in accordance with some embodiments.
Figure 5B:
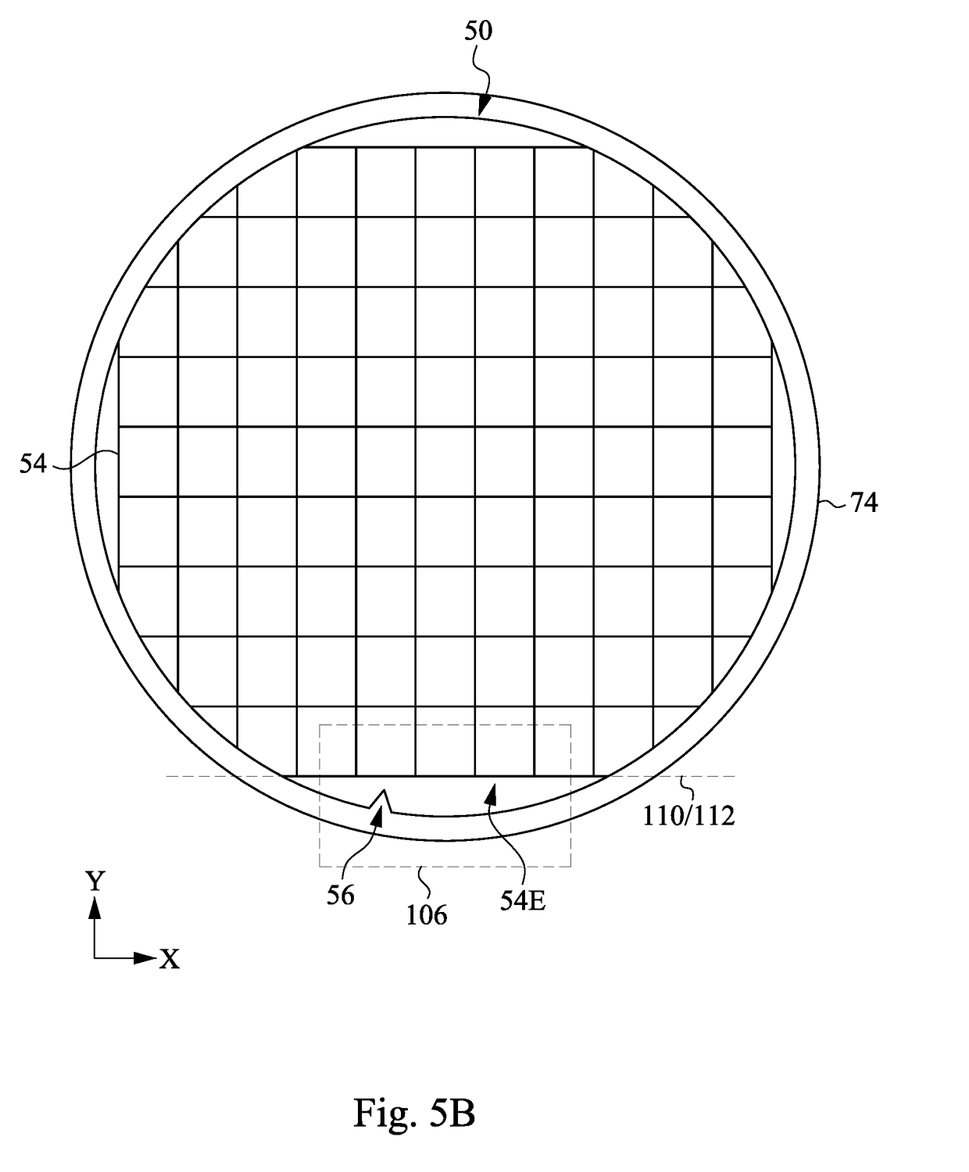

FIG. 4 is a flowchart of a method 400 for manufacturing a semiconductor device, in accordance with some embodiments. The method 400 may be performed using the ion exposure apparatus 70 of FIGS. 3A and 3B, which are described together with FIG. 4. Specifically, the method 400 may be performed by the controller 82 of the ion exposure apparatus 70, which controls the various features of the ion exposure apparatus 70 to perform the steps of the method 400. The method 400 includes steps for a wafer alignment process (e.g., steps 404-408) and steps for an ion exposure process (e.g., step 410). FIGS. 5A and 5B are top-down views of the platen 74 during the wafer alignment process, and are also described together with FIG. 4.

In step 402, the wafer 50 is placed on the platen 74. The wafer 50 is initially oriented on the platen 74 using the notch 56. Orienting the wafer 50 using the notch 56 provides a starting point for wafer alignment, which helps ensure an outer edge 54E of the integrated circuit dies 54 is within the field of view 106 of the camera 80. More specifically, the notch 56 is placed the field of view 106 of the camera 80 during placement of the wafer 50.

In step 404, the current position (or instant position) of the wafer 50 is measured using the outer edge 54E of the integrated circuit dies 54. The current position of the wafer 50 is measured by measuring the current position (or instant position) of the outer edge 54E of the integrated circuit dies 54 with machine vision using the camera 80. Specifically, the outer edge 54E of the integrated circuit dies 54 is photographed using the camera 80, and the outer edge 54E of the integrated circuit dies 54 is recognized in the photographs with machine vision. The camera 80 has a field of view 106, and the position of the outer edge 54E of the integrated circuit dies 54 in the field of view 106 (e.g., along the X-direction and the Y-direction) is measured with machine vision.

In step 406, the displacement between the current position of the wafer 50 and a reference position of the wafer 50 is determined. The current position of the wafer 50 is defined by a first line 110, which extends along the outer edge 54E of the integrated circuit dies 54 in the field of view 106. The reference position of the wafer 50 is defined by a second line 112, and is referenced with respect to the ion beam 86. The second line 112 is a pre-defined reference position for the outer edge 54E of the integrated circuit dies 54 in the field of view 106, and its position is calibrated with respect to the ion beam 86. The wafer 50 is aligned with respect to the ion beam 86 when the first line 110 is substantially parallel (within process variations) to the second line 112. The displacement of the wafer 50 is an angular displacement.

The angular displacement $\theta_1$ between the current position of the wafer 50 and the reference position of the wafer 50 with respect to the ion beam 86 is determined by calculating the angle between the first line 110 and the second line 112.

The angular displacement $\theta_1$ may be calculated using Equation (1), in which $m_1$ is the slope of the first line 110 (in the X-direction and the Y-direction) and $m_2$ is the slope of the second line 112 (in the X-direction and the Y-direction). The slope of the first line 110 may be calculated from the current position of the outer edge 54E of the integrated circuit dies 54 (in the X-direction and the Y-direction), and the slope of the second line 112 may be a known value (in the X-direction and the Y-direction).

$$\theta_1 = \tan^{-1}\left(\frac{m_1 - m_2}{1 + m_1 m_2}\right) \quad (1)$$

In step 408, the platen 74 is rotated by the angular displacement $\theta_1$. The platen 74 is thus rotated so that the first line 110 is parallel to the second line 112 (e.g., the first line 110 and the second line 112 have the same slope). The platen 74 may be rotated by actuating the drive mechanism 76 to rotate the platen 74 by a desired distance around an axis of rotation. After step 408, the first line 110 is aligned (within process variations) with the second line 112.

In step 410, the ion beam 86 is directed at the wafer 50. Specifically, the platen 74 is translated by actuating the drive mechanism 76 to move the wafer from the first position (see FIG. 3A) to the second position (see FIG. 3B). Accordingly, the platen 74 is translated into the path of the ion beam 86. The ion beam 86 is then generated using the ion beam generator 78. Moving the wafer 50 to the second position in the path of the ion beam 86 allows the ion beam 86 to be directed at the wafer 50 when it is generated.

Figure 6A:
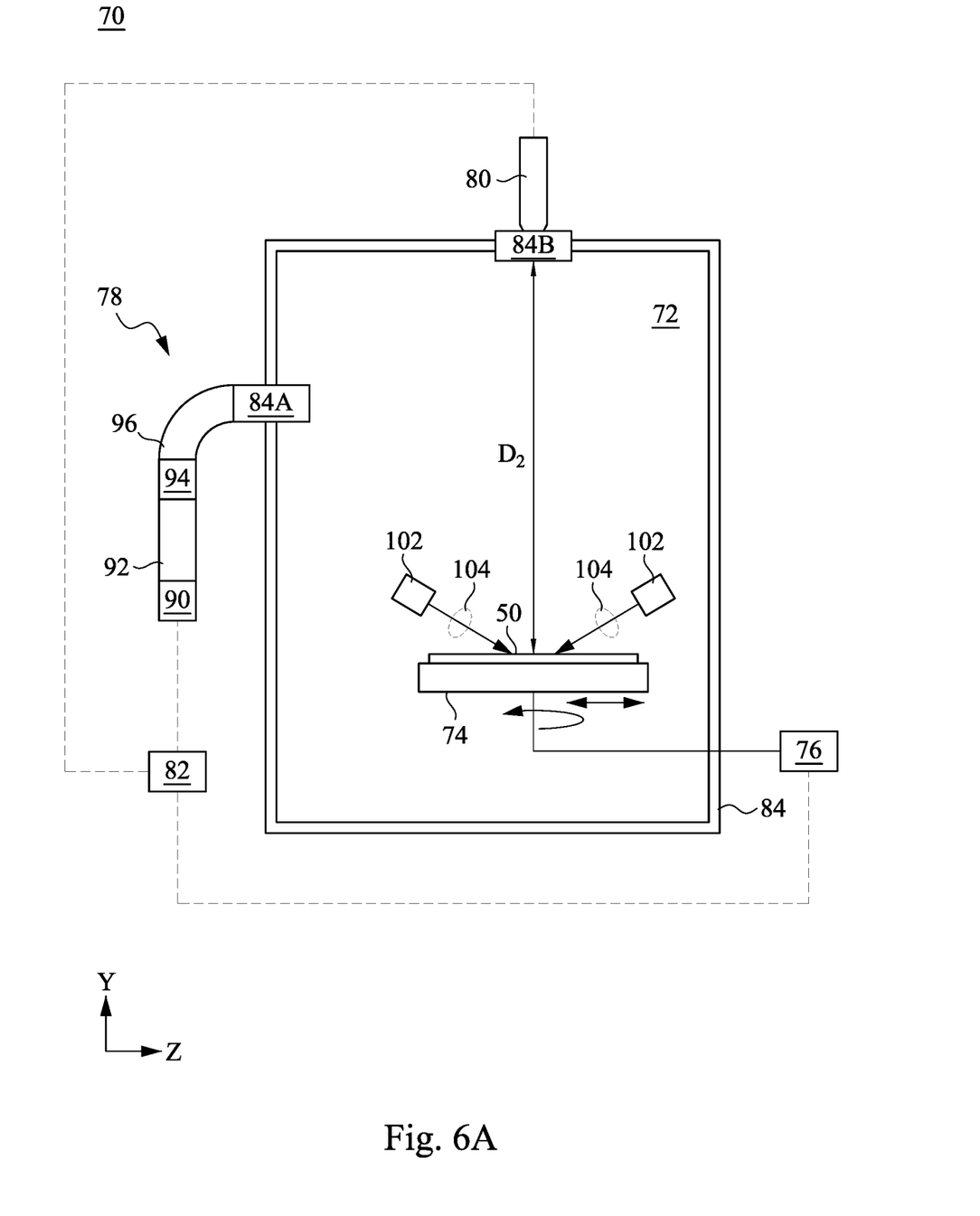
FIGS. 6A and 6B are diagrams of an ion exposure apparatus, in accordance with some embodiments.
Figure 6B:
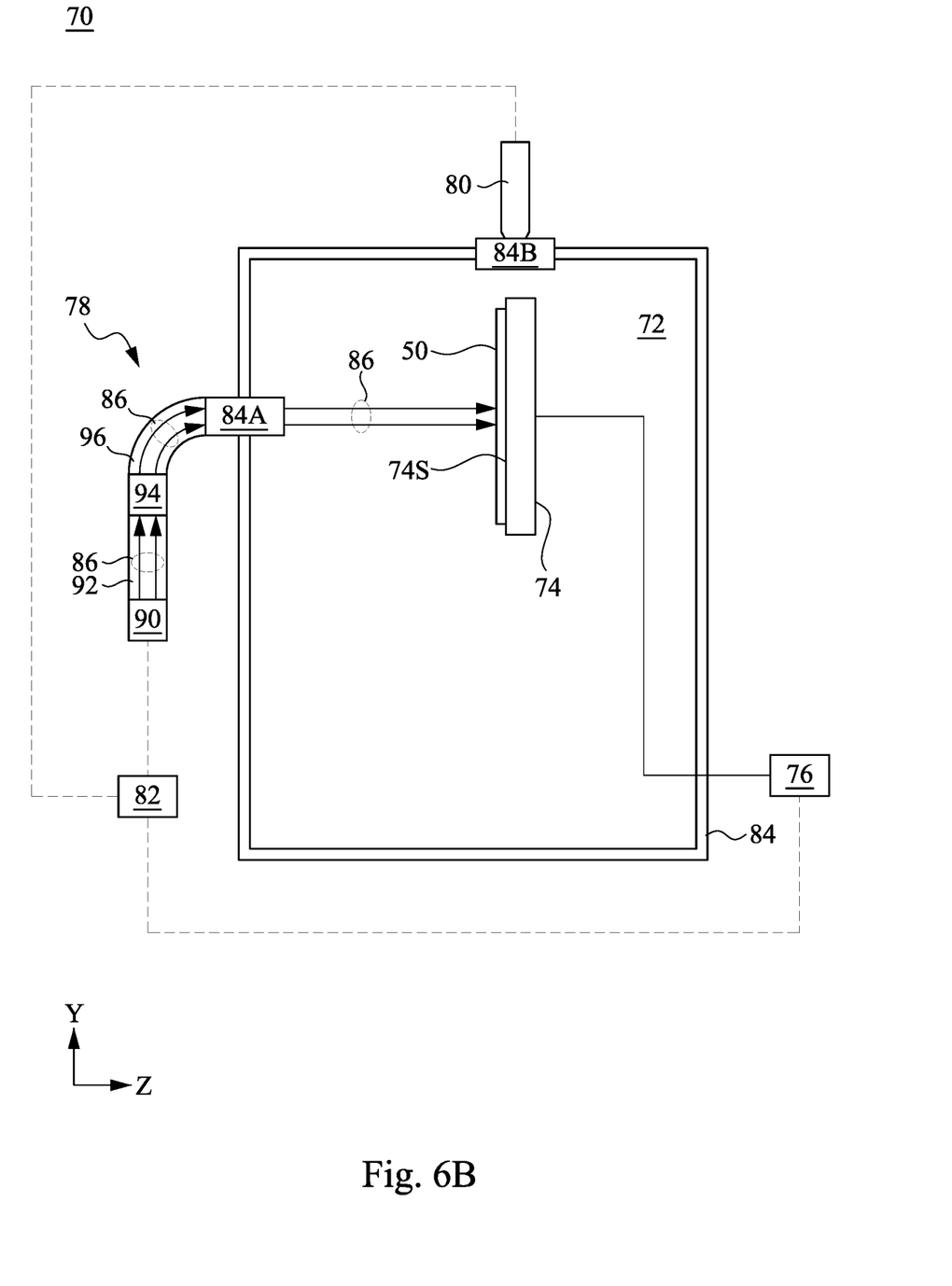

FIGS. 6A and 6B are diagrams of an ion exposure apparatus 70, in accordance with some embodiments. This embodiment is similar to the embodiment of FIGS. 3A and 3B, except the camera 80 is disposed outside of the chamber 72. The camera 80 is operable to photograph the wafer 50 through an aperture 84B in the chamber wall 84. The camera 80 and the aperture 84B may be disposed at the top of the chamber 72. For example, the ion beam generator 78 may be large and disposed at the sides of the chamber 72, leaving no room for the camera 80 to be disposed outside of and at the sides of the chamber 72. In some embodiments, the platen 74 has different orientation in the first position and in the second position. The drive mechanism 76 is also operable to tilt the platen 74 so that the wafer 50 may be oriented in different directions. Specifically, the wafer 50 may be oriented to be parallel to the ion beam 86 during the wafer alignment process, as shown by FIG. 6A, and the drive mechanism 76 may then be used to tilt the platen 74 by 90 degrees so that the wafer 50 is perpendicular to the ion beam 86 during the ion exposure process, as shown by FIG. 6B. In some embodiments, the light source(s) 102 are disposed in the chamber 72 so that the wafer 50 may still be sufficiently illuminated by the light 104. The light source(s) 102 may be offset from the aperture 84B and may be oriented diagonally with the surface of the wafer 50 to improve scattering of the light 104.

In some embodiments where the camera 80 is disposed outside of the chamber 72, the camera 80 has a large focal length, such as a focal length in the range of 64 mm to 128 mm. When a large focal length is used, the camera 80 may be disposed outside of the chamber 72, has a large FOV, and has a large working distance. In some embodiments, the camera 80 has a sensor size of one-quarter inch, a working distance $D_2$ in the range of 1 m to 2 m, a FOV of up to 300 mm, and a resolution in the range of 0.05 μm to 0.1 μm.

The camera 80 may have other focal lengths and resolutions. In some embodiments where the camera 80 is disposed outside of the chamber 72, the camera 80 has a focal length in the range of 10.67 mm to 21.33 mm. In some embodiments, the camera 80 has a sensor size of one-quarter inch, a working distance $D_2$ in the range of 1 m to 2 m, a FOV of up to 300 mm, and a resolution of up to 0.3 m.

Embodiments may achieve advantages. Performing the wafer alignment process by measuring the position of the outer edge 54E of the integrated circuit dies 54 with the camera 80 allows the wafer 50 to be more accurately angularly aligned with respect to the ion beam 86 during the ion exposure process. Aligning the wafer 50 with respect to the ion beam 86 may improve within-wafer uniformity of the ion exposure process, reduce wafer-to-wafer process variations, reduce device defects, and improve device performance. Further, performing wafer alignment with the outer edge 54E alleviates the need for dedicated alignment features (e.g., alignment marks) in the wafer, reducing the quantity of patterning processes that are performed. Manufacturing costs may thus be reduced.

In an embodiment, a method includes: placing a wafer on an implanter platen, the wafer including integrated circuit dies; measuring a position of the wafer by measuring a position of an outer edge of the integrated circuit dies with a camera; determining an angular displacement between the position of the wafer and a reference position of the wafer; and rotating the implanter platen by the angular displacement. In some embodiments of the method, the wafer includes a notch, and placing the wafer on the implanter platen includes aligning the wafer using the notch. In some embodiments of the method, the camera has a field of view, the wafer includes a notch, and placing the wafer on the implanter platen includes placing the notch in the field of view of the camera. In some embodiments, the method further includes, after rotating the implanter platen: directing an ion beam at the wafer, the ion beam angularly aligned with the reference position of the wafer. In some embodiments of the method, the camera is disposed outside of a path of the ion beam. In some embodiments, the method further includes, after rotating the implanter platen: moving the implanter platen in the path of the ion beam.

In an embodiment, a method includes: placing a wafer on an implanter platen, the wafer including integrated circuit dies; measuring a position of an outer edge of the integrated circuit dies; determining an angle between a first line and a second line, the first line extending along the position of the outer edge, the second line being along a reference position for the outer edge; and rotating the implanter platen by the angle. In some embodiments of the method, the wafer is placed on a surface of the implanter platen, and the implanter platen is rotated around an axis, the axis being perpendicular to the surface of the implanter platen. In some embodiments of the method, measuring the position of the outer edge includes: capturing an image of the outer edge with a camera; and detecting the position of the outer edge in the image using machine vision. In some embodiments of the method, the reference position for the outer edge is referenced with respect to an ion beam, the method further including: after rotating the implanter platen by the angle, directing the ion beam at the wafer. In some embodiments of the method, the position of the outer edge is measured with the implanter platen disposed in a first position outside of a path of the ion beam, the method further including: moving the implanter platen to a second position in the path of the ion beam. In some embodiments of the method, the implanter platen has different orientations in the first position and in the second position. In some embodiments of the method, the implanter platen has the same orientation in the first position and in the second position.

In an embodiment, an apparatus includes: a chamber; a platen in the chamber, the platen operable to support a wafer; a drive mechanism connected to the platen, the drive mechanism operable to move the platen within the chamber; an ion beam generator operable to direct an ion beam at the platen; a camera operable to measure a position of an outer edge on the wafer; and a controller communicatively coupled to the camera, the ion beam generator, and the drive mechanism, the controller configured to: determine a position of the wafer from the position of the outer edge; determine a displacement between the position of the wafer and the ion beam; and reduce the displacement between the position of the wafer and the ion beam by controlling the drive mechanism to move the platen within the chamber. In some embodiments of the apparatus, the camera is disposed in the chamber. In some embodiments of the apparatus, the camera is disposed outside the chamber. In some embodiments of the apparatus, the camera is disposed at a top of the chamber. In some embodiments of the apparatus, the camera is a charge-coupled device (CCD) camera. In some embodiments of the apparatus, the controller is further configured to: control the drive mechanism to translate the platen into a path of the ion beam. In some embodiments of the apparatus, the wafer is disposed on a surface of the platen, and the controller is further configured to: control the drive mechanism to orient the platen so that the ion beam is normal to the surface of the platen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
  placing a wafer on an implanter platen, the wafer comprising integrated circuit dies laid out in a grid;
  measuring a current position of the wafer by measuring a position of an outer borderline of the grid of the integrated circuit dies with a camera, wherein the outer borderline of the grid of the integrated circuit dies is defined by a border of a photoresist pattern that extends along the outer borderline of the grid of the integrated circuit dies, wherein measuring the position of the outer borderline of the grid of the integrated circuit dies comprises:
    capturing an image of the border of the photoresist pattern defining the outer borderline of the grid of the integrated circuit dies with the camera; and
    detecting the position of the outer borderline of the grid of the integrated circuit dies in the image using machine vision;
  determining an angular displacement between the current position of the wafer and a reference position of the wafer; and
  rotating the implanter platen by the angular displacement.

2. The method of claim 1, wherein the wafer comprises a notch, and placing the wafer on the implanter platen comprises aligning the wafer using the notch.

3. The method of claim 1, wherein the camera has a field of view, the wafer comprises a notch, and placing the wafer on the implanter platen comprises placing the notch in the field of view of the camera.

4. The method of claim 1 further comprising, after rotating the implanter platen:
  directing an ion beam at the wafer, the ion beam angularly aligned with the reference position of the wafer.

5. The method of claim 4, wherein the camera is disposed outside of a path of the ion beam.

6. The method of claim 5 further comprising, after rotating the implanter platen:
  moving the implanter platen in the path of the ion beam.

7. A method comprising:
  placing a wafer on an implanter platen, the wafer comprising a grid of integrated circuit dies;
  measuring a current position of an outer edge of the grid of the integrated circuit dies, wherein the outer edge of the grid of the integrated circuit dies is a continuous segment of a border of a photoresist pattern for forming the integrated circuit dies;
  determining an angle between a first line and a second line, the first line extending along the current position of the outer edge, the second line being along a reference position for the outer edge; and
  rotating the implanter platen by the angle.

8. The method of claim 7, wherein the wafer is placed on a surface of the implanter platen, and the implanter platen is rotated around an axis, the axis being perpendicular to the surface of the implanter platen.

9. The method of claim 7, wherein measuring the current position of the outer edge comprises:
  capturing an image of the outer edge with a camera; and
  detecting the current position of the outer edge in the image using machine vision.

10. The method of claim 7, wherein the reference position for the outer edge is referenced with respect to an ion beam, the method further comprising:
  after rotating the implanter platen by the angle, directing the ion beam at the wafer.

11. The method of claim 10, wherein the current position of the outer edge is measured with the implanter platen disposed in a first position outside of a path of the ion beam, the method further comprising:
  moving the implanter platen to a second position in the path of the ion beam.

12. An apparatus comprising:
  a chamber;
  a platen in the chamber, the platen operable to support a wafer comprising a grid of integrated circuit dies;
  a drive mechanism connected to the platen, the drive mechanism operable to move the platen within the chamber;
  an ion beam generator operable to direct an ion beam at the platen;
  a camera operable to capture an image of an outer borderline of the grid of the integrated circuit dies; and
  a controller communicatively coupled to the camera, the ion beam generator, and the drive mechanism, the controller configured to:
    determine a current position of the wafer by detecting a position of the outer borderline of the grid of the integrated circuit dies in the image using machine vision, wherein the outer borderline of the grid of the integrated circuit dies is defined by a border of a photoresist pattern that extends along the outer borderline of the grid of the integrated circuit dies;

determine a displacement between the current position of the wafer and the ion beam; and reduce the displacement between the current position of the wafer and the ion beam by controlling the drive mechanism to move the platen within the chamber.

13. The apparatus of claim 12, wherein the camera is disposed in the chamber.

14. The apparatus of claim 12, wherein the camera is disposed outside the chamber.

15. The apparatus of claim 14, wherein the camera is disposed at a top of the chamber.

16. The apparatus of claim 12, wherein the camera is a charge-coupled device (CCD) camera.

17. The apparatus of claim 12, wherein the controller is further configured to:

control the drive mechanism to translate the platen into a path of the ion beam.

18. The apparatus of claim 12, wherein the wafer is disposed on a surface of the platen, and the controller is further configured to:

control the drive mechanism to orient the platen so that the ion beam is normal to the surface of the platen.

19. The apparatus of claim 12, wherein the photoresist pattern is used for forming the integrated circuit dies.

20. The apparatus of claim 12, wherein the image of the outer borderline is an image of a continuous segment of the border of the photoresist pattern.

* * * * *